United States Patent [19]
Clark

[11] 4,158,368
[45] Jun. 19, 1979

[54] MAGNETOSTRICTIVE TRANSDUCER
[75] Inventor: Arthur E. Clark, Adelphi, Md.
[73] Assignee: The United States of America as represented by the Secretary of the Navy, Washington, D.C.
[21] Appl. No.: 685,867
[22] Filed: May 12, 1976
[51] Int. Cl.² ............................................. F16K 31/04
[52] U.S. Cl. ................................. 137/487.5; 251/129; 335/3; 335/215; 310/26
[58] Field of Search ................. 251/129, 11, 326, 327; 137/455, 487.5; 335/3, 215; 236/87, 101 E; 310/26

[56] References Cited
U.S. PATENT DOCUMENTS

| 2,556,906 | 6/1951 | Del Mar | 137/487.5 X |
| 2,843,147 | 7/1958 | Penther | 137/487.5 |
| 3,077,552 | 2/1963 | Kuppel | 137/487.5 X |
| 3,174,716 | 3/1965 | Salter | 335/3 X |
| 3,414,010 | 12/1968 | Sparrow | 251/129 X |
| 3,638,153 | 1/1972 | Sparrow | 251/129 X |
| 3,857,543 | 12/1974 | McKeen | 251/129 |
| 3,968,898 | 7/1976 | Beer | 251/129 X |

FOREIGN PATENT DOCUMENTS

| 534978 | 3/1941 | United Kingdom | 236/87 |
| 164761 | 10/1964 | U.S.S.R. | 335/215 |

OTHER PUBLICATIONS
Magnetic and Magnetoelastic Properties of Highly Magnetostrictive Rare Earth–Iron Laves Phase Compounds by A. E. Clark, A.I.P. Conference Proceedings 18 (1974).

Primary Examiner—Arnold Rosenthal
Attorney, Agent, or Firm—R. S. Sciascia; A. L. Branning; R. E. Bushnell

[57] ABSTRACT

Improved magnetostrictive materials are combined in a novel arrangement to provide a transducer of the electromechanical type particularly suited for the precise control of fluid flow. An embodiment according to this invention comprises a valve assembly having a discharge ported, cylindrical housing of a material exhibiting positive magnetostriction, a plunger of a material exhibiting negative magnetostriction disposed within the housing, the plunger provided with a tapered nose initially in close fitment within the discharge port to restrain the flow of fluids, and means to create a magnetic field around the assembly. As the materials are exposed to the magnetic field the housing expands relative to the contracting plunger, causing the plunger to separate from close, seated fitment within the discharge port, thereby allowing flow through the port. One of the materials may be selected from a non-magnetostrictive material. An alternative embodiment according to this invention comprises a magnetostrictive member interconnected to a plate slidably disposed within a conduit, said plate having an aperture adapted for alignment with the interior conduit passageway, and means to create a magnetic field around the magnetostrictive member. As the member is exposed to the magnetic field, the plate aperture is adjusted within the conduit passageway to control the flow of fluids.

18 Claims, 7 Drawing Figures

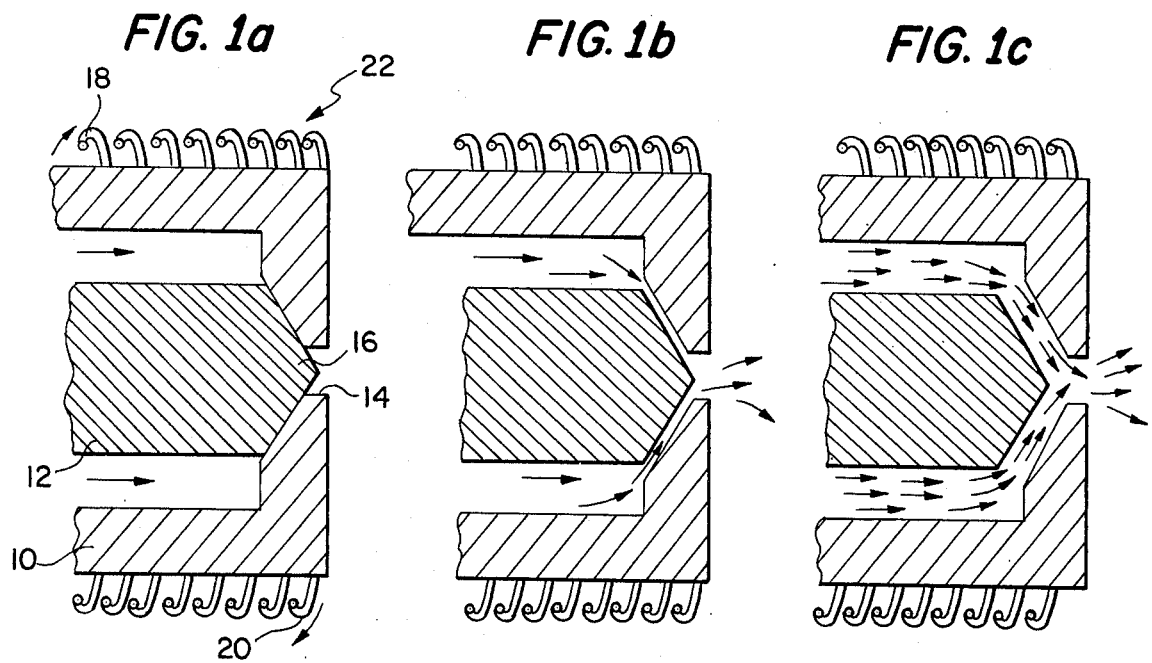
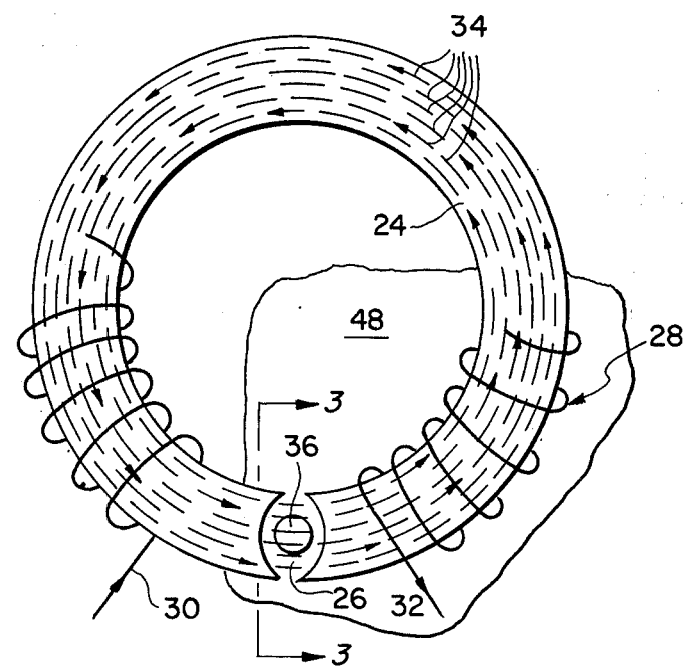

MAGNETOSTRICTIVE TRANSDUCER

BACKGROUND OF THE INVENTION

This invention relates to magnetostrictive transducers and more particularly to transducers adapted for use as fluid flow control devices.

DESCRIPTION OF THE PRIOR ART

Although there are many electromechanical transducers, there are some electromechanical conversions which are more demanding on known transducers. In the past, because of the inherent disadvantages in the materials then available, magnetostrictive transducers were not able to generate usable magnetostrains that could be transformed into sufficient mechanical motion.

The ability of a transducer in general to interconvert two forms of energy rests on the particular properties of the material used. Piezoelectric substances, like quartz, ammonium-dihydrogen-phosphate (ADP), and Rochelle salt acquire a charge between certain crystal surfaces when placed under a stress.

Conversely, they acquire a stress when a voltage is placed across them. Electrostrictive materials exhibit the same effects, but are polycrystalline cermaics that have to be properly polarized by a high electrostatic field. Some examples are barium titanate and lead zirconate titanate (PZT). A magnetostrictive material is one that changes dimensions when placed in a magnetic field, and conversely, changes the magnetic field within and around it when stressed. Magnetostrictive materials can also be polarized in order to avoid frequency doubling. Heretofore, typical magnetostrictive materials were composed of nickel- and iron-alloys. Although these magnetostrictive materials exhibit some magnetostriction at room temperatures which enables them to be used in transducer devices, their uses have been extremely limited and it has always been desirable to obtain other magnetostrictive materials which have much greater magnetostriction.

Certain heavy rare earth elements have magnetostrictions approximately 1,000 times greater than iron and about 200 times greater than nickel. However, a disadvantage of these materials is that these large magnetostrictions are present only at cryogenic temperatures and are most pronounced in the neighborhood of absolute zero. At room temperature (about 300° K.) these rare earth elements exhibit very little magnetostriction since their magnetic ordering temperatures fall below room temperature. Under these conditions, magnetostrains generated are typically of the order of 10–100 ($\times 10^{-6}$ in/in.). A more desirable magnetostrictive alloy would be one that develops large magnetostrains and is not limited to operating temperatures below room temperatures.

Several new alloys of these rare earth elements have been developed which possess similar thermal and mechanical properties, but which also possess large magnetostrictions. Maximum strains of from 300–3,000 ($\times 10^{-6}$ in/in.) at room temperatures are now attainable—over 30 times greater than those previously attained. These alloys are generally ternary mixtures of two heavy rare elements which include praseodymium (Pr), terbium (Tb), samarium (Sm), holmium (Ho), erbium (Er), and dysprosium (Dy) in combination with iron (Fe). Quatenary alloys combining three heavy rare earth elements with iron are also promising.

A need for precise and rapid micrometering of the flow of gases or liquids has long existed, and although many devices have been developed to meet that need, none have been very simple in design or in operation. Most have required several complex mechanical elements to cooperate together to meet whatever the requirements may have been. The need for a simple flow control valve exists in applications calling for microliter flow control, for use as a controlled leak source, for use in a mass spectrometer, for supplying anesthesis gases, for blending and/or bleeding of fuels in process control systems, and in applications calling for extremely rapid, precise, and controlled motions adapted to be used in an active feedback control system. Due to the recent advances in materials technology, magnetostrictive alloys combined with the above mentioned rare earth elements can be utilized in a novel fashion to serve as precise flow control devices.

SUMMARY OF THE INVENTION

Accordingly, it is an object of the present invention to provide an improved transducer.

Another object of the present invention is to provide an improved magnetostrictive transducer which is small, compact, rugged, and yet reliable, extremely simple in design and inexpensive to manufacture.

It is another object of this invention to provide an improved magnetostrictive transducer for performing energy conversions between electrical and mechanical systems.

It is a further object of this invention to provide an improved magnetostrictive transducer which is rapidly responsive to excitations.

A still further object of this invention is to provide a magnetostrictive transducer that is capable of operating at room temperatures.

It is a still further object of the invention to provide an improved magnetostrictive transducer which is capable of rapidly undergoing changes in dimension to provide for usable mechanical motions.

It is another object of the invention to provide a flow control device which can accurately control the flow of fluids.

Briefly, in accordance with one embodiment of this invention, these and other objects are attained by providing a flow control valve comprised of a cylindrical housing, a tapered plunger, and a magnetizing means. A discharge port at the forward end of the housing is adapted to receive the tapered nose of the plunger disposed within and along the main longitudinal axis of the housing to initially prevent fluid flow.

The housing is composed of a material that exhibits high positive magnetostriction (i.e. expands under a magnetic field) and the plunger is either magnetically inactive or composed of a material that exhibits high negative magnetostriction (i.e. contracts under a magnetic field). The magnetic means comprise an electrical coil encircling the longitudinal axis of the housing. When electrical current is passed through the coils, the magnetically sensitive materials either expand or contract, depending on the sense of the material. The relative dimensional change of these materials is reflected in a relative separation of the plunger nose from the housing port, resulting in an opening permitting precise control of fluid discharge from the housing. The valve may be actively controlled by a feedback control system utilizing sensor means downstream from the discharge port. Further, whether the housing is magnetostrictively sensed positive or negative would be determined by whether the valve port is to be normally open or normally closed in the absence of a magnetic field. In alternative embodiments the relative dimensional changes in the magnetostrictive materials are utilized by mechanical means interconnecting apertures means to align apertures. When the magnetic field is applied, the expansion/contraction of the magnetostrictive materials allows apertures to be selectively exposed resulting in a precise control of fluid flow.

BRIEF DESCRIPTION OF THE DRAWINGS

A more complete appreciation of the invention and many of the attendant advantages thereof will be readily appreciated as the same becomes better understood by reference to the following detailed description when considered in connection with the accompanying drawings wherein:

FIGS. 1(a)-1(c) is a sequence diagram of a portion of the valve in cross section showing the valve opening;

FIG. 2 shows a front view of an alternative embodiment;

DESCRIPTION OF THE PREFERRED EMBODIMENT

Figure 3:
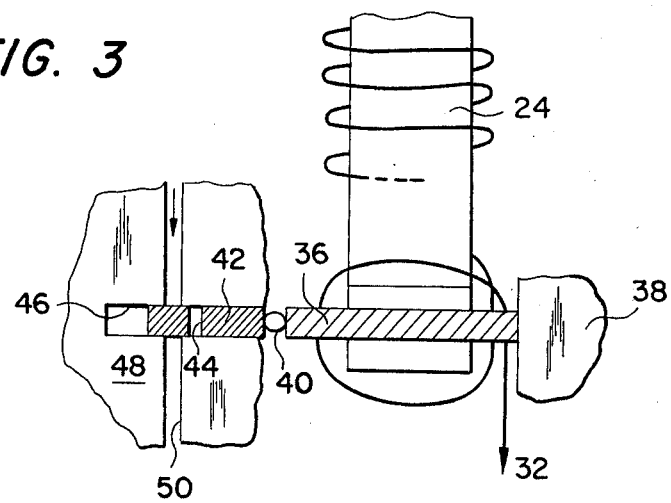
FIG. 3 shows a side view, partially in section, of the device as seen along the line 3—3 of FIG. 2.

Referring now to the drawings wherein like reference characters designate identical or corresponding parts throughout the several views, in FIG. 1(a) there is shown disposed along a longitudinal axis a cylindrical valve body 10 in spaced apart relation to an internal elongated plunger 12, said valve body terminating at a forward end with a discharge port 14. The forward end of the plunger has a tapered nose 16 adapted to seat within the discharge port in a tight fit to initially close off fluid flow. To provide a magnetic field, an electrical wire is wrapped around the valve housing, starting with the input at 18 and ending with the output at 20, thereby defining a coil 22.

The valve body is preferably comprised of a material that exhibits large magnetostriction. Depending on whether the application calls for a valve that is normally open or normally closed when no magnetic field in acting, a material exhibiting negative magnetostriction or one that exhibits positive magnetostriction would be selected. When the material is exposed to a magnetic field, the former material will contract and the latter material will expand. The valve shown in FIG. 1(a) depicts the situation where the valve is normally closed and the body is composed of a material exhibiting large positive magnetostriction. The plunger is preferably composed of a material that exhibits negative magnetostriction. However, either the body or the plunger could be made from magnetically inactive materials such as brass or aluminum, but this would not provide as great a relative displacement between the valve members as would be provided if the two members were to be composed of oppositely-sensed magnetostrictive materials. For inverse operation, the signs of the magnetostrictive materials would be interchanged.

Using new and highly magnetostrictive rare earth alloys, movements of 0.001-0.005 in. can easily be attained without the use of any mechanical advantage mechanisms. Rare earth alloys exhibiting large positive magnetostrictions are those comprised of iron with terbium (Tb) or praseodymium (Pr), with the former being the better. Several suitable alloys are $TbFe_2$, $TbFe_3$, or Terfenol-D, $Tb_{0.27}Dy_{0.73}Fe_2$. Rare earth materials exhibiting high negative magnetostrictions are best illustrated by alloys of iron with erbium (Er) and samarium (Sm), and to a lesser extent those containing dysprosium (Dy) and holmium (Ho). Several suitable alloys are $SmFe_2$, $ErFe_2$, or $Sm_{0.7}Ho_{0.3}Fe_2$. These new magnetostrictive alloys help to reduce the amount of power required to develop saturation magnetization and magnetostriction.

Upon introduction of electrical energy into the coil 22, a magnetic field is established that creates magnetic flux within the magnetostrictive material. This simultaneous energization of the two valve elements results in an expansion of the valve housing and a contraction of the plunger, thereby creating a relative displacement between the two at the discharge port. Referring to FIG. 1(b), the displacement allows a controlled flow to be initiated and in FIG. 1(c) the valve body is at maximum separation from the plunger, providing the maximum area for the flow.

The valve members can easily be fabricated using any standard processes known in the art. For example, casting, powder metallurgy or epoxy bonding are all possible methods. Casting is sometimes fairly difficult because the materials are somewhat brittle and thus would be limited to simple geometries. Power metallurgy offers a method that is simpler than casting and is more versatile since slightly more complex geometries could be manufactured. The method would lend itself well to mass production. Epoxy bonding is perhaps the best of the three methods, both with respect to the type of valve geometries that can be fabricated and as to the mass production of parts. For increased resistance to wear and to corrosion, the materials could be plated with some suitable material, for example, chromium.

Referring now to FIG. 2, an alternative valve embodiment has high permeability magnetic material 24 in the shape of a toroid with an air gap 26. A magnetic field is provided by a coil 28 of electrical wire wrapped around the torus having current input 30 and output 32. By passing current through the coil, magnetic flux is created in the toroid and is shown by dashed lines 34 in FIG. 2. In FIG. 3, magnetostrictive rod 36, secured by attachment means 38 at one end, has connecting means 40 at the other end connected to plate 42 having aperture 44, said plate adapted to slide within a slot 46 of a member 48 having flow passageway 50. Upon energization of the coil 28, a magnetic field is established through the air gap 26, causing the magnetostrictive rod 36 therein to expand or contract, which correspondingly forces the plate aperture to be adjusted within the passageway 50 for flow adjustment.

Figure 4:
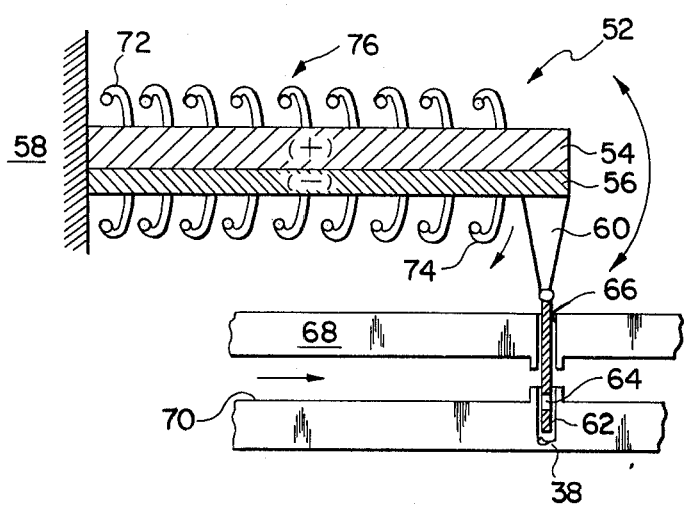
FIG. 4 illustrated a side elevation, in section, of yet another embodiment.

Referring now to FIG. 4, an alternative valve embodiment has magnetostrictive control member 52 comprising a first, upper layer 54 of magnetostrictive material laterally joined with a second, lower layer 56 of magnetostrictive material of opposite sign than the first to form a composite bar. The bar is supported at one end by holding means 58. Connecting means 60 interconnect the other end of the bar to a plate 62 having aperture 64, said plate slidably disposed within slot 66 of a conduit 68 having a central passageway 70. An electrical wire having input lead 72 and output lead 74 is wrapped about the longitudinal axis of the composite bar to form a coil 76 which, when supplied with electrical current, causes a magnetic field to be established within the bar. This magnetic field acts to produce a change in dimension of the mateials used to form the bar, causing the upper/lower layers to expand/contract, and thereby forcing the unsecured end of the bar to move transversely with respect to the longitudinal axis. The transverse motion of the bar displaces the connector 60 causing the apertured plate to be alignıngly positioned within the conduit passageway to control fluid flow. As shown in FIG. 4 the upper layer is composed of a material exhibiting large positive magnetostriction. Suitable materials were mentioned above. A similar composite bar would consist of one non-magnetostrictive element.

Figure 5:
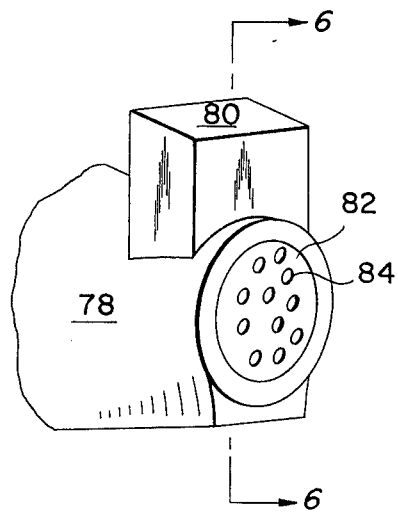
FIG. 5 shows a perspective view of a valve having stacked aperture plates for flow control.
Figure 6:
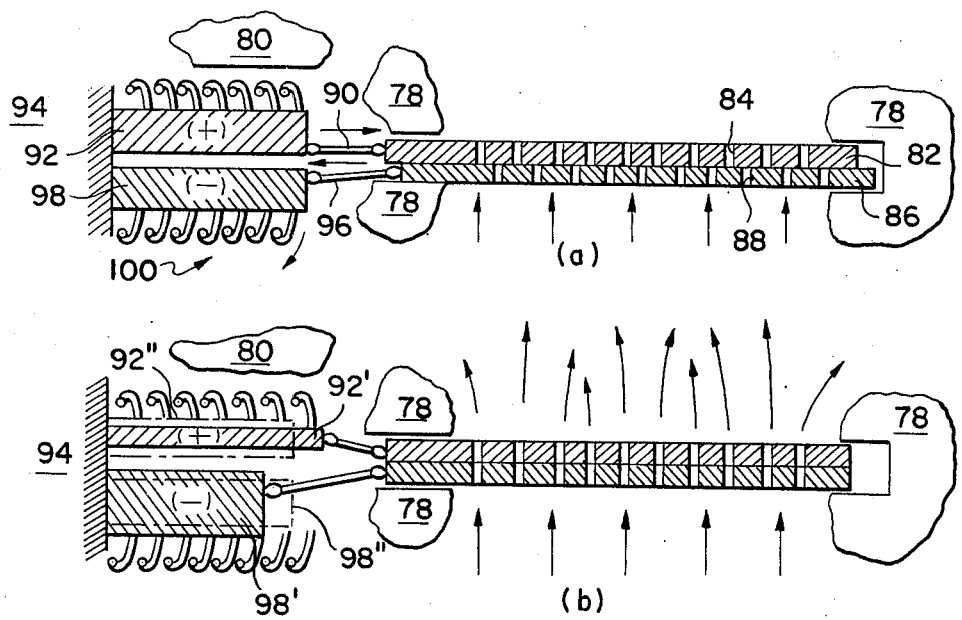
FIGS. 6(a)-(b) shows a section of the device of FIG. 5 taken along line 6—6 showing an alignment sequence of the apertured plates.

Referring now to FIG. 5, another alternative valve comprises a valve housing 78 with enclosure 80 and plate 82 having apertures 84 thereon. A sectioned side view of FIG. 6(a) shows the valve initially blocking flow, and FIG. 6(b) shows the valve after a magnetic field has caused expansion/contraction of magnetostrictive valve materials to allow flow. The first outer plate 82 in in FIG. 6(a) is slidingly positioned adjacent to a second, inner, plate 86 with apertures 88, which are not in alignment with the apertures 84 of the first plate. A first connecting means 90 interconnects the first apertured plate with a magnetostrictive shaft 92 attached to the support 94 within the valve enclosure. Similarly, a second connecting means 96 interconnects the second apertured plate with a second magnetostrictive shaft 98 of opposite magnetostrictive sign than the first shaft, and is attached to 94. A magnetic field is supplied by means of an electrical coil 100 wrapped around the magnetostrictive shafts, the coil generally being housed within the enclosure 80. As shown, the first and the second magnetostrictive shafts are composed, respectively, of positive- and negative-sensed magnetostrictive materials. When an electrical current passes through the coil, the magnetic field created in the magnetostrictive shafts causes the first shaft 92 to expand and the second shaft 98 to contract, thereby causing the first and second plates to be displaced by the connecting means 90 and 96, with the direction of plate motion shown by the arrows in FIG. 6(a). Upon undergoing the displacement, the apertures 84 on the outer plate 82 are aligned with the apertures 88 on the inner plate 86, thereby permitting flow therethrough. FIG. 6(b) shows the result of the change in relative dimensions of the magnetostrictive materials, with the original dimensions of shafts 92 and 98 shown in phantom as 92" and 98" respectively. The new shapes are shown as 92' and 98', respectively.

Figure 7:
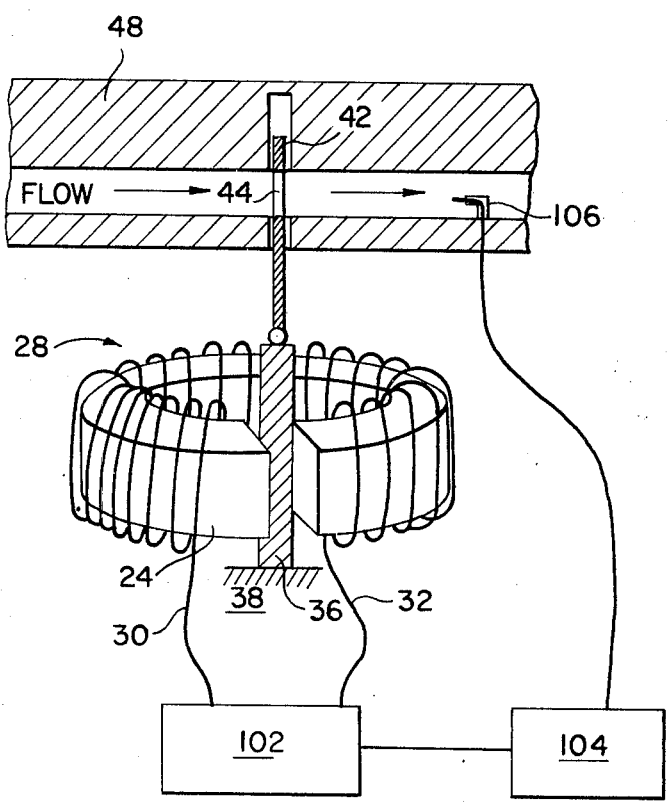
FIG. 7 is a diagrammatic view of a feedback control system using a flow control valve of this invention.

In operation, the flow control devices according to this invention could be adapted for use in a feedback control loop. Typical of such an application would be the toroidal magnet described above relating to FIG. 2 used to control flow as shown in FIG. 7. A flow sensing device 106 is inserted into the conduit passageway downstream of the apertured plate 42. As fluids pass through the conduit and through the aperture 44, the sensor generates an output representative of that flow. A desired flow rate is known and can be used for comparison by comparator means 104 to produce a signal which is sent to a feedback control means 102. The signal compares the output value from the sensor with the desired value, and any difference other than zero would be used by the feedback control to vary the electrical current passing through the coil 28 of the toroid to adjust the magnetic field and cause the magnetostrictive shaft 36 to undergo a change in dimension and thereby adjust the position of the aperture in the conduit.

Obviously, numerous modifications and variations of the present invention are possible in light of the above teachings. It is therefore to be understood that within the scope of the appended claims the invention may be practiced otherwise than as specifically described herein.

What is claimed as new and desired to be secured by Letters Patent of the United States is:

1. A magnetostrictive valve for control of the flow of fluids, comprising:

a conduit having a passageway for flow;

means for varying the amount of flow within the passageway, including a plate slidably disposed transversely to the conduit and having at least one aperture positionable in communication with the passageway;

means for producing a magnetic field;

magnetostrictive control means external to the conduit and isolated from the flow;

the control means being made from one or more alloys of iron and one or more rare earth metals;

connecting means to interconnect said magnetostrictive control means means to the flow varying means, whereupon producing a magnetic field about the magnetostrictive control means, the plate aperture is adjusted with respect to the passageway thereby controlling the flow of fluids through the conduit, feedback control means adapted to adjust the magnetic field about the magnetostrictive control means;

a flow sensor adapted to generate an output value representative of the actual flow through the conduit; and immobile flow comparator means to compare a value representative of a desired flow through the conduit with said output value to produce a signal to regulate said feedback control means, whereby the plate aperture is adjusted with respect to the passage to establish and maintain a desired flow through the passageway.

2. A magnetostrictive valve to control the flow of fluids as recited in claim 1 wherein:

said magnetostrictive control means comprises a first layer of material having a large magnetostriction of one sense and a second layer of material joined to form a composite bar, one end of said bar being restrained and the other end of said bar being attached to said connecting means.

3. A magnetostrictive valve to control the flow of fluids as recited in claim 2 wherein:

said second layer is comprised of a material having a large magnetostriction of opposite sign than said first layer.

4. A magnetostrictive valve to control the flow of fluids as recited in claim 1 wherein said magnetostrictive control means comprise:

a high permeability magnetic material in the shape of a toroid, said toroid having a sector of the torus removed; and a shaft of magnetostrictive material disposed within the sector, one end of said shaft being secured and the other end being attached to said connecting means, said magnetic field created within the gap by an electrical coil disposed around the toroid.

5. A magnetostrictive valve as recited in claim 1, wherein the alloys are selected from the group consisting of;
iron and terbium
iron and praseodynium
iron and dysprosium
iron and erbium
iron and samarium;
iron, erbium and samarium;
iron and holmium;
iron, samarium and holmium;
or mixtures thereof.

6. A magnetostrictive flow control device as set forth in claim 1, further comprised of:

the control means being a composite of the alloys, pivotally disposed with a restrianed end longitudinally opposite a distal end; and the flow varying means extending into the flow and arranged to travel transversely to the direction of the flow.

7. A magnetostrictive valve as recited in claim 1 including a passageway for the flow, wherein, said control means comprises a first shaft of a positive sensed magnetostrictive alloy used in conjunction with a second shaft of negative sensed magnetostrictive alloy, both shafts restrained at one end; and said flow varying means comprises a first plate attached to the other end of said first shaft adjacent to a second plate attached to the other end of said second shaft, both first and second plates having apertures disposed thereon, said apertured plates adapted to be placed within the passageway whereby the apertures permit a variable adjustment in flow to allow fluids to flow through the passageway.

8. A magnetostrictive valve for control of the flow of fluids, comprising:

a conduit having a passageway for flow;

means for varying the amount of flow within the passageway, including a plate slidably disposed within said conduit and having at least one aperture disposed thereon;

means for producing a magnetic field;

magnetostrictive control means;

the control means being made from one or more alloys of iron and one or more rare earth metals;

connecting means to interconnect said magnetostrictive control means to the flow varying means, the control means having a first layer of material with a large magnetostriction of one sense and a second layer of material joined to form a composite bar, one end of said bar being secured and the other end of said bar being attached to said connecting means;

whereupon producing a magnetic field about the magnetostrictive control means, the plate aperture is adjusted with respect to the passageway thereby controlling the flow of fluids through the conduit;

feedback control means adapted to adjust the magnetic field about the magnetostrictive control means;

a flow sensor adapted to generate an output value representative of the actual flow through the conduit; and immobile flow comparator means to compare a value representative of a desired flow thorugh the conduit with said output value to produce a signal to regulate said feedback control means whereby the plate aperture is adjusted with respect to the passageway to establish and maintain a desired flow through the passageway.

9. A magnetostrictive valve to control the flow of fluids as recited in claim 8 wherein:

said second layer is comprised of a material with a large magnetostriction of opposite sign than said first layer.

10. A magnetostrictive valve for control of the flow of fluids, comprising:

a conduit having a passageway for flow;

means for varying the amount of flow within the passageway including a plate slidably disposed within said conduit;

means for producing a magnetic field;

magnetostrictive control means;

the control means being made from one or more alloys of iron and one or more rare earth metals;

connecting means to interconnect said magnetostrictive control means to the flow varying means;

the control means having a first layer of material with a large magnetostriction of one sense and a second layer of material with a large magnetostriction of opposite sign than the first layer, joined to form a composite bar, one end of said bar being secured and the other end of said bar being attached to said connecting means;

whereupon producing a magnetic field about the magnetostrictive control means, the plate aperture is adjusted with respect to the passageway thereby controlling the flow of fluids through the conduit;

feedback control means adapted to adjust the magnetic field aobut the magnetostrictive control means;

a flow sensor adapted to generate an output value representative of the actual flow through the conduit; and immobile flow comparator means to compare a value representative of a desired flow through the conduit with said output value to produce a signal to regulate said feedback control means whereby the plate aperture is adjusted with respect to the passageway to establish and maintain a desired flow through the passageway.

11. The valve set forth in claim 10, further comprising:

the control means being isolated from the flow.

12. The valve set forth in claim 10, further comprising:

the control means being isolated by the conduit from the flow.

13. A magnetostrictive valve to control the flow of fluids comprising:

a conduit having a passageway for flow;

means for varying the amount of flow within the passageway, including a plate slidably disposed within said conduit and having at least one aperture disposed about the passageway;

magnetostrictive control means;

means for producing a magnetic field about the control means the control means being made from one or more alloys of iron and one or more rare earth metals;

connecting means to interconnect said magnetostrictive control to the flow varying means;

feedback control means adapted to adjust the magnetic field about the magnetostrictive control;

a flow sensor positioned within the conduit passageway and adapted to generate an output value representative of the actual flow through the conduit; and immobile flow comparator means to compare a preset value representative of a desired flow through the conduit with said output value to produce a signal to regulate said feedback control means;

whereby the plate aperture is adjusted with respect to the passageway to establish and maintain a desired flow through the passageway.

14. A magnetostrictive valve as recited in claim 13, further comprising:

the control means being a composite of the alloys, pivotally disposed with a restrained end longitudinally opposite a distal end; and, the flow varying means cooperating with the distal end.

15. A valve as recited in claim 13 wherein the alloys are selected from the group consisting of:
iron and terbium;
iron and praseodymium;
iron, terbium and praseodymium;
iron and dysprosium;
iron, terbium and dysprosium;
iron, praseodymium and dysprodium;
iron, terbium, praseodymium and dysprosium;
iron, and erbium;
iron and samarium;
iron, erbium and samarium;
iron, samarium and dysprosium;
iron and holmium;
iron, samarium and holmium;
or mixtures thereof.

16. A magnetostrictive valve as recited in claim 13 wherein:

said control means comprises a first shaft of a positive sensed alloy used in conjunction with a second shaft of negative sensed alloy and, each shaft having a restrained end opposite a distal end; and said flow varying means comprises a first plate attached to the distal end of said first shaft adjacent to a second plate attached to the distal end of said second shaft, both first and second plates having apertures disposed thereon, said apertured plates adapted to be placed within the passageway of the flow control device, whereby as the shafts are exposed to the magnetic field, each plate is adjusted within the passageway and the apertures permit a variable adjustment in flow.

17. A magnetostrictive valve to control the flow of fluids as recited in claim 13 wherein:

said magnetostrictive control means comprises a first layer of material having a large magnetostriction of one sense and a second layer of material joined to form a composite bar, one end of said bar being secured and the other end of said bar being attached to said connecting means.

18. A magnetostrictive valve to control the flow of fluids as recited in claim 17 wherein:

said second layer is comprised of a material having a large magnetostriction of opposite sign than said first layer.

* * * * *